United States Patent
Xu et al.

(10) Patent No.: US 10,421,878 B2
(45) Date of Patent: Sep. 24, 2019

(54) HIGH-CHI BLOCK COPOLYMERS FOR DIRECTED SELF-ASSEMBLY

(71) Applicant: Brewer Science Inc., Rolla, MO (US)

(72) Inventors: Kui Xu, Rolla, MO (US); Mary Ann Hockey, Rolla, MO (US); Eric Calderas, Rancho Cucamonga, CA (US)

(73) Assignee: Brewer Science, Inc., Rolla, MO (US)

( * ) Notice: Subject to any disclaimer, the term of this patent is extended or adjusted under 35 U.S.C. 154(b) by 24 days.

(21) Appl. No.: 14/599,103

(22) Filed: Jan. 16, 2015

(65) Prior Publication Data
US 2015/0197594 A1   Jul. 16, 2015

Related U.S. Application Data

(60) Provisional application No. 61/928,062, filed on Jan. 16, 2014.

(51) Int. Cl.
| | | |
|---|---|---|
| *C09D 153/00* | (2006.01) | |
| *C08F 293/00* | (2006.01) | |
| *G03F 7/00* | (2006.01) | |

(52) U.S. Cl.
CPC ........ *C09D 153/00* (2013.01); *C08F 293/005* (2013.01); *G03F 7/0002* (2013.01); *C08F 2438/03* (2013.01); *Y10T 428/24802* (2015.01); *Y10T 428/3154* (2015.04)

(58) Field of Classification Search
CPC . B81C 1/00031; G03F 7/0002; C09D 153/00; C08F 293/005; C08F 2438/03
USPC .......................................................... 427/58
See application file for complete search history.

(56) References Cited

U.S. PATENT DOCUMENTS

| | | |
|---|---|---|
| 7,964,107 B2 | 6/2011 | Millward |
| 8,226,838 B2 | 7/2012 | Cheng et al. |
| 8,257,908 B2 | 9/2012 | Sakaguchi et al. |
| 8,398,868 B2 | 3/2013 | Cheng et al. |
| 8,691,925 B2 | 4/2014 | Wu et al. |

(Continued)

FOREIGN PATENT DOCUMENTS

| | | |
|---|---|---|
| CN | 101548390 | 9/2009 |
| JP | 2008-520450 | 6/2008 |

(Continued)

OTHER PUBLICATIONS

Zhao et al., "SAXS Analysis of the Order-Disorder Transition and the Interaction Parameter of Polystyrene-block-poly(methyl methacrylate)," Macromolecules 41 (24), 9948-9951, 2008.

(Continued)

*Primary Examiner* — Brian K Talbot
(74) *Attorney, Agent, or Firm* — Hovey Williams LLP

(57) ABSTRACT

Compositions for directed self-assembly (DSA) patterning techniques are provided. Methods for directed self-assembly are also provided in which a DSA composition comprising a block copolymer (BCP) is applied to a substrate and then self-assembled to form the desired pattern. The block copolymer includes at least two blocks and is selected to have a high interaction parameter ($\chi$). The BCPs are able to form perpendicular lamellae by simple thermal annealing on a neutralized substrate, without a top coat. The BCPs are also capable of micro-phase separating into lines and spaces measuring at 10 nm or smaller, with sub-20-nm $L_0$ capability.

26 Claims, 4 Drawing Sheets

(56) References Cited

U.S. PATENT DOCUMENTS

| | | | |
|---|---|---|---|
| 2008/0020290 A1 | 1/2008 | Hatakeyama et al. | |
| 2008/0132070 A1 | 6/2008 | Li et al. | |
| 2008/0193658 A1* | 8/2008 | Millward | B81C 1/00031 427/401 |
| 2008/0251284 A1 | 10/2008 | Colburn et al. | |
| 2009/0297784 A1 | 12/2009 | Xu et al. | |
| 2010/0316849 A1* | 12/2010 | Millward | B81C 99/009 428/195.1 |
| 2011/0008956 A1 | 1/2011 | Lee et al. | |
| 2011/0165341 A1 | 7/2011 | Mirkin et al. | |
| 2012/0034419 A1 | 2/2012 | Washburn et al. | |
| 2012/0046415 A1 | 2/2012 | Millward et al. | |
| 2013/0022785 A1 | 1/2013 | Ellison et al. | |
| 2013/0029113 A1 | 1/2013 | Nealey et al. | |
| 2013/0045361 A1 | 2/2013 | Willson et al. | |
| 2013/0078576 A1* | 3/2013 | Wu | C08F 293/00 430/296 |
| 2013/0224442 A1* | 8/2013 | Kim | C09D 153/00 428/172 |
| 2013/0230705 A1 | 9/2013 | Nealey et al. | |
| 2013/0273330 A1 | 10/2013 | Wang et al. | |
| 2013/0313223 A1* | 11/2013 | Fujikawa | B81C 1/00031 216/13 |
| 2014/0187054 A1* | 7/2014 | Park | H01L 21/02118 438/781 |
| 2014/0193614 A1* | 7/2014 | Kim | G03F 7/0002 428/195.1 |
| 2014/0234589 A1* | 8/2014 | Koh | G03F 7/0002 428/195.1 |
| 2014/0273476 A1 | 9/2014 | Cheng et al. | |
| 2014/0299969 A1 | 10/2014 | Xu et al. | |
| 2015/0287592 A1* | 10/2015 | Park | G03F 7/0002 438/702 |
| 2015/0380266 A1* | 12/2015 | Wuister | G03F 7/0002 257/622 |
| 2016/0178999 A1* | 6/2016 | Wuister | G03F 1/70 716/51 |
| 2016/0297986 A1* | 10/2016 | Onses | B81C 1/00031 |

FOREIGN PATENT DOCUMENTS

| | | |
|---|---|---|
| JP | 2012-219236 | 11/2012 |
| JP | 2014-001296 | 1/2014 |
| WO | 2011/068960 A2 | 6/2011 |
| WO | 2011/073013 A1 | 6/2011 |
| WO | 2013/041958 A1 | 3/2013 |
| WO | 2013073505 | 4/2015 |

OTHER PUBLICATIONS

Yokoyama et al.,"Self-Diffusion of Asymmetric Diblock Copolymers with a Spherical Domain Structure," Macromolecules, 31 (22), 7871-7876, 1998.
Hardy et al., "Model ABC Triblock Copolymers and Blends near the Order-Disorder Transition," Macromolecules, 35 (8), pp. 3189-3197, 2002.
Maeda et al., "Dual Mode Patterning of Fluorine-Containing Block Copolymers through Combined Top-down and Bottom-up Lithography," Chemistry of Materials, 24 (8), 1454-1461, 2012.
Bates et al., "Polarity-Switching Top Coats Enable Orientation of Sub-10-nm Block Copolymer Domains," Science, vol. 338, pp. 775-779, Nov. 9, 2012.
Jung et al., "A Path to Ultranarrow Patterns Using Self-Assembled Lithography," Nano Lett., 10 (3), 1000-1005, 2010.
International Search Report and Written Opinion dated Apr. 30, 2015 in corresponding PCT/US2015/011811 filed Jan. 16, 2015.
Machine Translation in English of JP2008-520450, 38 pages.
Rincon Delgadillo et al., "All track directed self-assembly of block copolymers: process flow and origin of defects," Proc. of SPIE, v. 8323, 83230D-1-83230D-9, 2012.
Rathsack et al., "Pattern Scaling with Directed Self Assembly Through Lithography and Etch Process Integration," Proc. of SPIE, v. 8323, 83230B-1-83230B-14, 2012.
Tiron et al., "Pattern density multiplication by direct self assembly of block copolymers: Towards 300mm CMOS requirements," Proc. of SPIE, v. 8323, 83230O-1-83230O-7, 2012.
Tiron et al., "Self-Assembly Patterning: Towards 300mm CMOS Requirements," Litho Extension Symposium, Miami, USA, Oct. 20, 2011.
Hinsberg, Bill, "Introduction to / Status of Directed Self-Assembly," DSA Workshop, Kobe, Japan, 2010 IBM Corporation.
Welander et al., "Rapid Directed Assembly of Block Copolymer Films at Elevated Temperatures," Macromolecules 41 (8), 2759-2761, 2008.
Herr, D., "Directed block copolymer self-assembly for nanoelectronics fabrication," J. Mater. Res., 26 (2), Jan. 28, 2011, 122-139.
Cheng et al., "Dense Self-Assembly on Sparse Chemical Patterns: Rectifying and Multiplying Lithographic Patterns Using Block Copolymers," Advanced Materials, 20, 3155-3158, 2008.
Ruiz et al., "Density Multiplication and Improved Lithography by Directed Block Copolymer Assembly," Science, 321, 936-939, 2008.
Wuister et al., "Lithography assisted self-assembly of contact holes on 300-mm wafer scale," J. Micro/Nanolith. MEMS MOEMS, 11(3), 031304-1-031304-9 (Jul.-Sep. 2012).
Li et al., "Block copolymer patterns and templates," Mater. Today, vol. 9, No. 9, 30-39, Sep. 2006.
Ryu et al., "A Generalized Approach to the Modification of Solid Surfaces," Science, vol. 308, 236-239, Apr. 8, 2005.
Gokan et al., "Dry Etch Resistance of Organic Materials", J. Electrochem. Soc., vol. 130, No. 1, 143-146, Jan. 1983.
Drockenmuller et al., "Covalent Stabilization of Nanostructures: Robust Block Copolymer Templates from Novel Thermoreactive Systems," Journal of Polymer Science: Part A: Polymer Chemistry, 2005, 43, 1028-1037.
Leiston-Belanger et al., "A Thermal and Manufacturable Approach to Stabilized Diblock Copolymer Templates," Macromolecules, 2005, 38, 7676-7683.
So et al., "Styrene 4-Vinylbenzocyclobutene Copolymer for Microelectronic Applications." J. Polym. Sci. Part A: Polym. Chem., 2008, 46: 2799-2806.
Park et al., "Enabling nanotechnology with self assembled block copolymer patterns", Polymer, 2003, 44, 6725-6760.
Liu et al., "Pattern transfer using poly(styrene-block-methyl methacrylate) copolymer films and reactive ion etching", J. Vac. Sci. Technol. B, 2007, 25, 1963-1968.
Nunns et al., "Inorganic block copolymer lithography," Polymer, 54, 1269-1284, 2013.
Bang et al., "Block Copolymer Nanolithography: Translation of Molecular Level Control to Nanoscale Patterns," Adv. Mater., 21, 4769-4792, 2009.
Guerrero et al., "Multifunctional hardmask neutral layer for directed self-assembly (DSA) patterning," Proc. of SPIE, v. 8680, 2013, 9 pages.
Machine Translation of JP2012-219236, 14 pages.
Machine Translation of JP2014-001296, 16 pages.
English Abstract of WO2013073505, 1 page.

* cited by examiner

HIGH-CHI BLOCK COPOLYMERS FOR DIRECTED SELF-ASSEMBLY

RELATED APPLICATION

This application claims the priority benefit of U.S. Provisional Patent Application No. 61/928,062, entitled HIGH-CHI BLOCK COPOLYMERS FOR DIRECTED SELF-ASSEMBLY, filed Jan. 16, 2014, each of which is incorporated by reference herein.

BACKGROUND OF THE INVENTION

Field of the Invention

The present disclosure relates to new block copolymers for inclusion in compositions that can be utilized for directed self-assembly pattern formation in the fabrication of microelectronic structures.

Description of the Prior Art

The increasing demand of smaller micro-fabricated devices requires a continuous decrease in the feature size of device components. Conventional photolithography techniques become increasingly difficult and costly as the feature size approaches 22 nm and smaller. To keep Moore's law moving forward, non-lithography techniques will become more and more important. An alternative approach to generate nanoscale patterns is directed self-assembly (DSA) of block copolymers (BCPs), which can feasibly provide highly ordered patternable morphologies such as lamellae and cylinders at a molecular level (<20 nm).

Currently, the use of DSA for generating lines and spaces utilizing conventional polystyrene-block-poly(methylmethacrylate) block copolymer (PS-b-PMMA) has shown to be in the critical dimension range of 28-50 nm pitch. A range of methods using both chemoepitaxy and graphoepitaxy pre-patterning process flows have been successful for creating both lines and spaces (lamellae) and contact holes (cylinders). In contrast, the resolution limit for single patterning 193 nm immersion scanners is 37 nm for dense lines and spaces and 40 nm for contact openings.

PS-b-PMMA has an inherent feature size limitation of about ~13 nm because of its low interaction parameter (Chi, or $\chi$), a fundamental measure of the block incompatibility in the BCPs. Although using multiple monomers in either block of the copolymer is not common or desired, due to potential inhomogeneity and incompatibility between the monomers, the properties of the BCP, such as $\chi$, can be altered by the use of comonomers in either block. High-$\chi$ BCPs, which usually contain highly polar blocks, fluorine-rich blocks, or silicon-rich blocks (e.g., polystyrene-block-2-vinylpyridines [PS-b-P2VP], polystyrene-block-polydimethylsiloxane [PS-b-PDMS], polystyrene-block-poly(2,2,2-trifluoroethyl methacrylate) [PS-b-PTFEMA], etc.) are thus under intense research for obtaining 10-nm and sub-10-nm patterns. However, high-$\chi$ BCPs are generally difficult to direct and orientate their DSA morphologies due to the disparate polarities and properties between blocks. Specifically, perpendicular orientation of thin film BCP-DSA is desired for lithographical application to generate useful nanoscopic patterns on substrates, particularly for lamellar-forming BCPs. Most known high-$\chi$ BCPs cannot easily form perpendicularly orientated morphology by simple thermal annealing as does PS-b-PMMA. They need either an extra top-coat layer or solvent annealing to obtain perpendicular orientation, which can greatly increase the manufacturing cost and complication.

SUMMARY OF THE INVENTION

The present invention broadly provides a method of forming a microelectronic structure using a new DSA composition. The method comprises providing a stack comprising: a substrate having a surface; and one or more optional intermediate layers on the substrate surface. A composition is applied to the intermediate layers, if present, or to the substrate surface, if no intermediate layers are present. The composition comprises a block copolymer comprising a first block and a second block, with the first block being selected from the group consisting of:
  (I) a polymer comprising random monomers of vinylbenzocyclobutene, styrene, and a monomer other than styrene or vinylbenzocyclobutene; and
  (II) a polymer comprising random monomers of vinyl biphenyl and styrene.

The composition is then caused to self-assemble into a self-assembled layer. The self-assembled layer comprises a first self-assembled region and a second self-assembled region different from the first self-assembled region.

In another embodiment, a microelectronic structure is provided. The structure comprises:
  a substrate having a surface;
  one or more optional intermediate layers on the substrate surface; and
  a layer of a self-assembling composition formed on the one or more optional intermediate layers, if present, or on the substrate surface, if no intermediate layers are present.

The self-assembling composition comprises a block copolymer comprising a first block and a second block, with the first block being selected from the group consisting of:
  (I) a polymer comprising random monomers of vinylbenzocyclobutene, styrene, and a monomer other than styrene or vinylbenzocyclobutene; and
  (II) a polymer comprising random monomers of vinyl biphenyl and styrene.

In another embodiment, the invention is concerned with a block copolymer comprising a first block and a second block. The first block is selected from the group consisting of:
  (I) a polymer comprising random monomers of vinylbenzocyclobutene, styrene, and a monomer other than styrene or vinylbenzocyclobutene; and
  (II) a polymer comprising random monomers of vinyl biphenyl and styrene.

The second block is selected from the group consisting of polymers of methyl methacrylate, lactic acid, ethylene oxide, methyl acrylate, vinyl ester, and vinyl amide.

In yet a further embodiment, the invention provides a composition comprising a block copolymer dissolved or dispersed in a solvent system. The block copolymer comprises a first block and a second block. The first block is selected from the group consisting of:
  (I) a polymer comprising random monomers of vinylbenzocyclobutene, styrene, and a monomer other than styrene or vinylbenzocyclobutene; and
  (II) a polymer comprising random monomers of vinyl biphenyl and styrene.

The second block is selected from the group consisting of polymers of methyl methacrylate, lactic acid, ethylene oxide, methyl acrylate, vinyl ester, and vinyl amide.

DETAILED DESCRIPTION OF THE PREFERRED EMBODIMENTS

Inventive Block Copolymers

Figure 1:
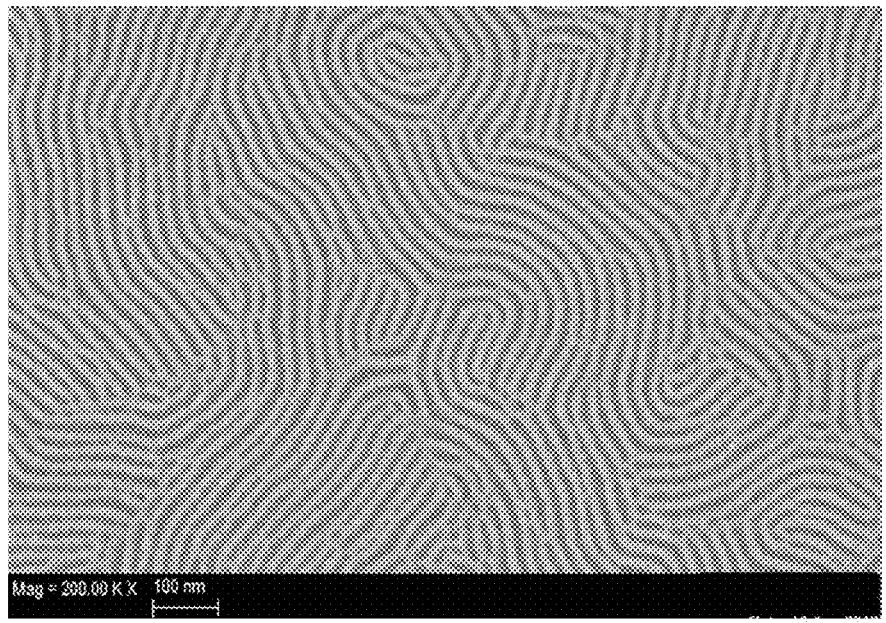
FIG. 1 is a scanning electron microscope (SEM) image of a fingerprint of the annealed BCP's of Example 1.

Compositions for use in the present invention are DSA compositions and include a block copolymer (typically a diblock copolymer) dissolved or dispersed in a solvent system. In general, DSA compositions contain two or more immiscible compounds (e.g., polymer blends) or a self-assembling compound comprising at least two components having distinct (and often opposite) characteristics, such as functionality, polarity, or water affinity, etch resistance, etc., which allow segregation (essentially nanophase separation) and alignment of the two compounds or components in a rational manner, as well as selective removal of one compound or component. Block copolymers, as noted above, are particularly well-suited to DSA techniques, as they can be synthesized containing at least two distinct blocks, allowing for each component to align under appropriate conditions, and to be selectively removed after alignment.

Suitable block copolymers for use in the present invention should contain two or more blocks of polymers that self-assemble at the appropriate time (e.g., when annealed). The block copolymer comprises first and second blocks.

1. First Block of Inventive Block Copolymers

A. VBCB Embodiment

In one embodiment, the first block is a polymer comprising random monomers of vinylbenzocyclobutene ("VBCB" and preferably 4-vinylbenzocyclobutene or "4-VBCB"), styrene, and a monomer other than VBCB or (unsubstituted) styrene. The monomer other than VBCB or styrene is selected from the group consisting of styrene-containing monomers, vinylpyridine (preferably 2-vinylpyridine or 4-vinylpyridine), and vinyl naphthalene. Preferably, the monomer is a styrene-containing monomer. As used herein, "styrene-containing monomer" refers to a monomer that has a styrene-moiety in its structure along with other atoms or moieties (e.g., the ring is substituted). "Styrene-containing monomer" does not include monomers that include only styrene, without other atoms or ring substitutions. Examples of suitable styrene-containing monomers include those selected from the group consisting of fluorostyrene (preferably 4-fluorostyrene), butyl styrene (preferably 4-tert-butyl styrene), vinylanisole (preferably 4-vinylanisole), methyl styrene, and trifluormethylstyrene. Advantageously, the VBCB block crosslinks upon heating to its crosslinking temperature, after annealing, for applications where that is desirable.

The molar percentage of styrene repeating units in the first block of this embodiment can be from about 0.1% to about 99.99%, preferably from about 10% to about 80%, and more preferably from about 10% to about 60%. The molar percentage of VBCB repeating units in the first block of this embodiment is from about 1% to about 99.99%, preferably from about 5% to about 70%, and more preferably from about 10% to about 60%. The molar percentage of the monomer other than the VBCB or styrene (e.g., fluorostyrene repeating units) in the first block can be from about 0.1% to about 99.99%, preferably from about 1% to about 60%, and more preferably from about 5% to about 35%.

B. VB Embodiment

In another embodiment, the first block is a polymer comprising random monomers of vinyl biphenyl ("VB," and preferably 4-vinyl biphenyl or "4-VB") and styrene. Even more preferably, first blocks according to this embodiment further comprise at least one other monomer, and preferably two other monomers, that are not VB or styrene. Preferred other monomers are selected from the group consisting of styrene-containing monomers (such as those noted above), vinylpyridine (preferably 2-vinylpyridine or 4-vinylpyridine), vinyl naphthalene, methyl styrene, and fluorostyrene (preferably 4-fluorostyrene). More preferably both methyl styrene and fluorostyrene (again, preferably 4-fluorostyrene) are present as other monomers. Advantageously, the VB block does not crosslink upon heating, for applications where crosslinking is undesirable.

The molar percentage of styrene repeating units in the first block of this embodiment is from about 0.1% to about 99.99%, preferably from about 10% to about 90%, and more preferably from about 10% to about 60%. The molar percentage of VB repeating units in the first block of this embodiment is from about 0.1% to about 99.99%, preferably from about 5% to about 75%, and more preferably from about 10% to about 50%.

In embodiments where fluorostyrene repeating units are present in the first block, the molar percentage of those units is from about 0.1% to about 99.99%, preferably from about 1% to about 40%, and more preferably from about 5% to about 30%. In embodiments where methyl styrene repeating units are present in the first block, the molar percentage of the methyl styrene present is from about 0.1% to about 99.99%, preferably from about 5% to about 60%, and more preferably from about 15% to about 60%.

2. Second Block of Inventive Block Copolymers

While a polymer formed of methyl methacrylate monomers (i.e., PMMA) is the most preferred second block, other second blocks could also be utilized, including those selected from the group consisting of polymers comprising monomers selected from the group consisting of lactic acid, ethylene oxide, vinyl esters, vinyl amides, and methyl acrylate.

3. Inventive Block Copolymer Properties

The inventive block copolymers have a weight average molecular weight of from about 1,000 g/mol to about 100,000 g/mol, and preferably from about 10,000 g/mol to about 50,000 g/mol. Furthermore, the polydispersity index ("PDI," as determined in Example 9) of the block copolymer is preferably from about 1.01 to about 1.50, and more preferably from about 1.01 to about 1.30. The inventive block copolymer has a $\chi$ value that is at least about 1.5 times, and preferably at least about 2 times the $\chi$ value of a polystyrene and poly(methyl methacrylate) block copolymer.

The ratio of the blocks in the copolymer varies, depending on the desired self-assembly microstructures and properties of the polymer. However, typically the volume ratio of first block to second block is from about 10:90 to about 90:10, and more preferably from about 20:80 to about 80:20.

"Volume ratio" as used herein is the ratio of the "volume" of each block of the polymer (where the volume is calculated by taking the molecular weight of that block of the polymer) and dividing it by the density of that block of the polymer. When the structure being formed is a hole, the volume ratio will typically be from about 75:25 to about 65:35, and more preferably about 70:30. When the structure being formed is a cylinder, the volume ratio will typically be from about 25:75 to about 35:65, and more preferably about 30:70. When the structure being formed are lamellae, lines, or spaces, the volume ratio will typically be from about 45:55 to about 55:45, and more preferably about 50:50.

Polymerization Methods

Suitable block copolymers can be created by using controlled radical polymerization techniques, such as reversible addition fragmentation chain transfer (RAFT), atom transfer radical polymerization (ATRP), stable free radical mediated polymerization (SFRP), etc. Scheme A shows a general reaction of using RAFT polymerization to create a block copolymer. The process to create a block copolymer utilizes a two-step reaction. First, one or more monomers (monomer A in Scheme A) is polymerized via RAFT polymerization in the presence of a radical initiator and a chain transfer agent (such as thiocarbonylthio compounds) to generate a polymer (polymer A in Scheme A) with a chain transfer agent moiety (such as thiocarbonylthio) at one chain end. The obtained polymer is then used as a macromolecular chain transfer agent in the second reaction, to effectuate the polymerization of a second monomer (monomer B in Scheme A) in the presence of a radical initiator to generate the block copolymer (A-B in Scheme A).

Scheme A

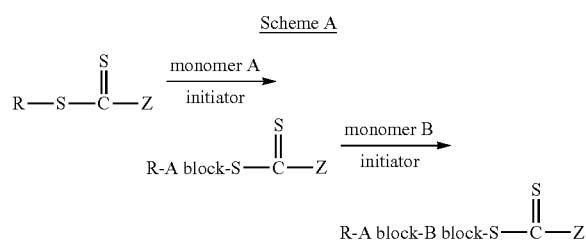

Suitable radical initiators for use in the RAFT polymerization method include, but are not limited to, 2,2'-azobis(2-methylpropionitrile) (AIBN), 4,4'-azobis(4-cyanovaleric acid) (ACVA), and 1,1'-azobis(cyclohexanecarbonitrile) (ACHN).

Suitable chain transfer agents include, but are not limited to, 2-cyano-2-propyl benzodithioate, 2-phenyl-2-propyl benzodithioate, 4-cyano-4-(phenylcarbonothioylthio)pentanoic acid, 2-cyano-2-propyl dodecyl trithiocarbonate, and 4-cyano-4-[(dodecylsulfanyl-thiocarbonyl)sulfanyl]pentanoic acid.

Suitable solvents include, but are not limited to, toluene, 1,4-dioxane, tetrahydrofuran, propylene glycol monomethyl ether acetate, and anisole.

Scheme B below shows a RAFT reaction scheme to prepare the inventive block copolymers where the VBCB embodiment (specifically 4-VBCB) is used for the first block, the monomer other than styrene or VBCB is 4-fluorostyrene, and PMMA is the second block. The RAFT process to create the block copolymer utilizes a two-step reaction. First, methyl methacrylate is polymerized via RAFT polymerization in the presence of a radical initiator and a chain transfer agent to generate a poly(methyl methacrylate) with a chain transfer agent moiety at one chain end. Next, the P(S-FS-VBCB)-b-PMMA block copolymer can be synthesized by using end-functionalized PMMA as a chain transfer agent, a radical initiator, and a mixture of styrene, 4-fluorostyrene, and 4-vinylbenzocyclobutene as the monomers.

Scheme B

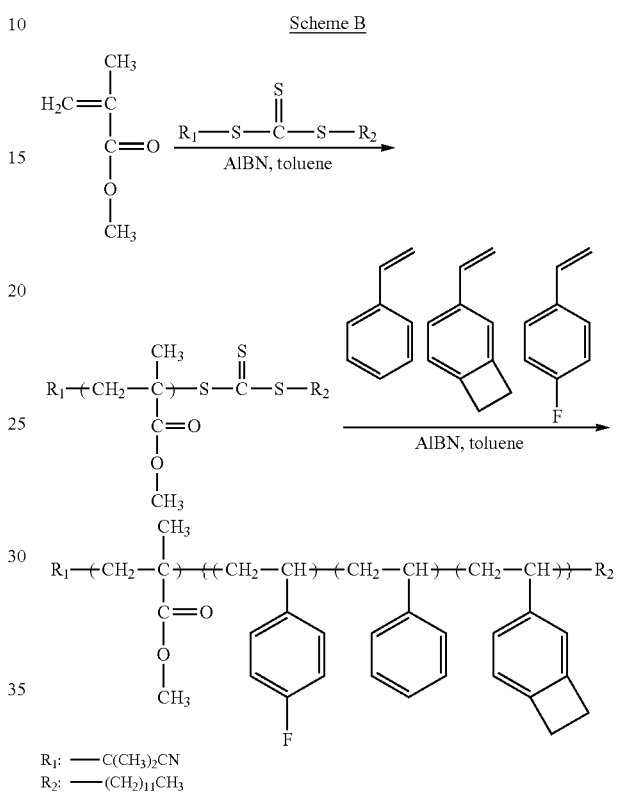

The chemical structure of the resulting block copolymer is shown in Scheme C. It will be appreciated that although the monomers of the first block are shown in a certain order, that is simply exemplary, and those monomers will be random throughout the first block. Additionally, the "x" and "y" simply indicate that what is shown is a snapshot of each overall block. That is, the block will be longer than shown, and will be polymerized to the desired size for the particular application.

Scheme C

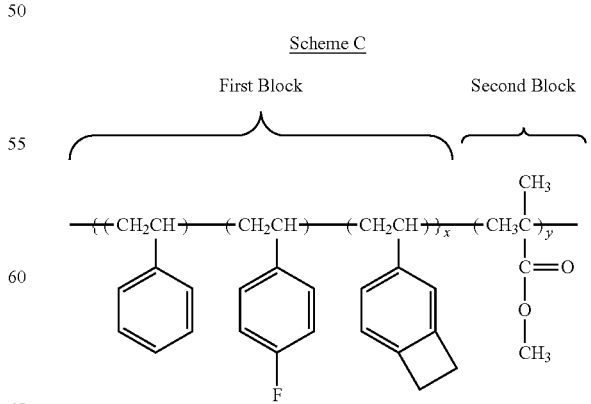

Scheme D shows the RAFT reaction scheme used to prepare the inventive block copolymers where the VB embodiment (specifically 4-VB) is used for the first block, both methyl styrene and 4-fluorostyrene are present in the first block, and PMMA is the second block. Again, a two-step reaction is utilized. First, methyl methacrylate is polymerized via RAFT polymerization in the presence of a radical initiator and a chain transfer agent to generate a poly(methyl methacrylate) with a chain transfer agent moiety at one chain end. Then, P(S-MS-FS-VB)-b-PMMA block copolymer can be synthesized by using end-functionalized PMMA as a chain transfer agent, a radical initiator, and a mixture of styrene, 4-fluorostyrene, methyl styrene, and vinylbiphenyl (VB) as the monomers.

Scheme D

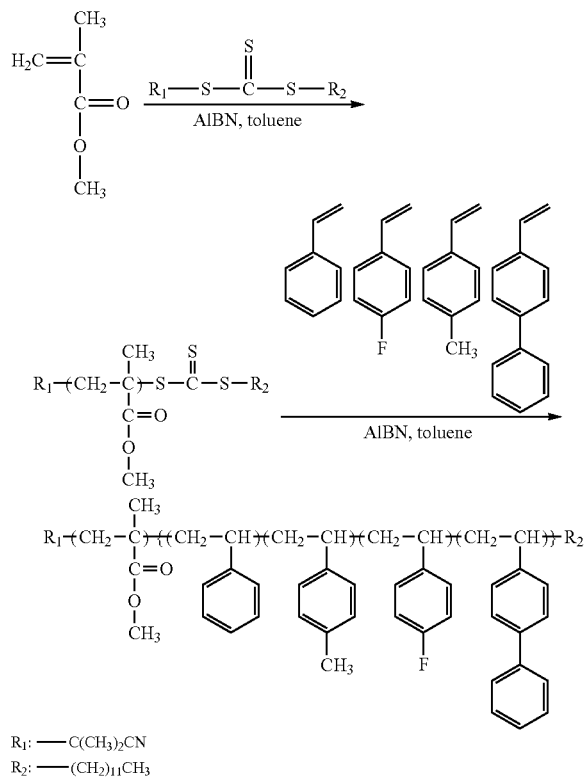

$R_1$: —C(CH$_3$)$_2$CN
$R_2$: —(CH$_2$)$_{11}$CH$_3$

The chemical structure of the resulting block copolymer is shown in Scheme E. Again, it will be appreciated that although the monomers of the first block are shown in a certain order, that is simply exemplary, and those monomers will be random throughout the first block. Additionally, the "x" and "y" simply indicate that what is shown is a snapshot of the overall block. That is, the block will be longer than shown, and will be polymerized the desired size for the particular application.

Scheme E

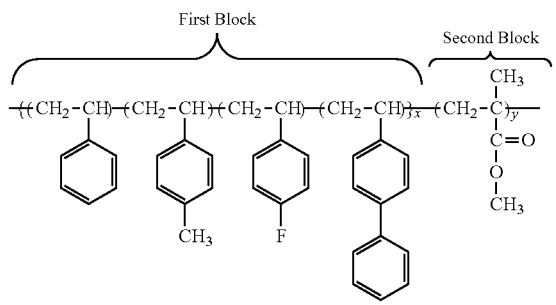

Inventive Composition

In addition to the block copolymer described above, the inventive compositions can include a number of optional ingredients, such as those selected from the group consisting of surfactants, acid catalysts, base catalysts, crosslinkers, and mixtures thereof. The DSA compositions are prepared by dissolving or dispersing the above-described block copolymer in a solvent system. Suitable solvents include those selected from the group consisting of propylene glycol monomethyl ether (PGME), propylene glycol monomethyl ether acetate (PGMEA), gamma-butyrolactone (GBL), cyclohexanone, cyclopentanone, ethyl lactate (EL), ethylacetoacetate (EAA), n-butyl acetate, methyl isobutyl carbinol (MIBC), 2-heptanone, isopropyl alcohol (IPA), methyl ethyl ketone (MEK), and mixtures thereof.

Preferred compositions will preferably have solids content of from about 0.1% by weight to about 5% by weight, more preferably from about 0.1% by weight to about 2% by weight, and even more preferably from about 0.1% by weight to about 1% by weight, based upon the total weight of the composition taken as 100% by weight. The amount of block copolymer in the composition will generally fall within the above ranges as well, since it is most likely the primary (and possibly only) solid present in the composition.

Methods of Using Inventive Compositions

The inventive DSA layer can be formed from the above-described compositions by any known application method, with some of those methods being described in U.S. Patent Application No. 2013/0273330, the entirety of which is incorporated by reference herein. One preferred method involves spin-coating the block copolymer composition onto a substrate at speeds from about 500 rpm to about 2,500 rpm, preferably from about 1,000 rpm to about 1,500 rpm, for a time period of from about 30 seconds to about 90 seconds, preferably from about 50 seconds to about 60 seconds.

After the block copolymer composition is applied, self-assembly can be carried out using any suitable technique, including thermal annealing, solvent annealing, microwave annealing, and combinations thereof. In a preferred embodiment, thermal annealing is carried out by heating the layer to a temperature above its glass transition temperature (Tg). That temperature would typically be from about 100° C. to about 300° C., and more preferably from about 110° C. to about 250° C., for a time period of from about 30 seconds to about 600 seconds, and preferably from about 60 seconds to about 120 seconds, in order to anneal the material and form the DSA layer. An optional second bake stage may be used to crosslink the material after microphase separation. The thickness of the DSA layer after baking is preferably from about 5 nm to about 60 nm, and more preferably from about 10 nm to about 40 nm, depending upon the molecular weight of each polymer block.

In one embodiment, the self-assembly is carried out right after the DSA composition is applied. In other words, there aren't any additional layers or other compositions applied on top of the DSA layer prior to annealing, as is the case in some prior art methods. Advantageously, the present invention provides for self-assembly to be carried out purely by thermal annealing. That is, some prior art methods require special other conditions (e.g., solvent annealing, annealing in an inert atmosphere), and those are avoided here.

The DSA layer can optionally be coated on top of a series of one or more underlayers selected from the group comprising bottom anti-reflective coatings, neutral brush layers, hardmask neutral layers (HM NL), hardmasks, spin-on carbon, or other layers. In some cases, a single layer, such as an HM NL, can perform the function of multiple layers, such as those of the bottom anti-reflective coatings, the neutral brush layer and the hardmask.

One optional intermediate layer is a hardmask layer. A hardmask layer can be formed by any known application method, with one preferred method being spin-coating at speeds from about 1,000 to about 5,000 rpm, and preferably from about 1,250 rpm to about 1,750 rpm, for a time period of from about 30 to about 120 seconds, and preferably from about 45 seconds to about 75 seconds. Suitable hardmask layers are preferably high-silicon content materials, such as those selected from the group consisting of silanes, siloxanes, and silsesquioxanes. Exemplary hardmask layers will generally compromise a polymer dissolved or dispersed in a solvent system, optionally along with one or more the following ingredients: surfactants, acid or base catalysts, and crosslinkers.

Preferred hardmask compositions will preferably have solids content of from about 0.1% by weight to about 70% by weight, more preferably from about 0.5% by weight to about 10% by weight, and even more preferably from about 1% by weight to about 2% by weight, based upon the total weight of the hardmask composition taken as 100% by weight. After the hardmask is applied, it is preferably heated to a temperature from about 100° C. to about 300° C., and more preferably from about 150° C. to about 250° C., and for a time period of from about 30 seconds to about 120 seconds, and preferably from about 45 seconds to about 60 seconds, to evaporate solvents. The thickness of the hardmask layer after baking is preferably from about 5 nm to about 50,000 nm, more preferably from about 5 nm to about 1,000 nm, and even more preferably from about 10 nm to about 100 nm. The hardmask layer should have an etch rate at least 0.75 times that of the block copolymer in a fluorine-rich plasma atmosphere, and at least 5 times slower than any SOC in an oxygen-rich plasma etch atmosphere. The hardmask thickness should not be affected by the solvent in the DSA composition (i.e., no hardmask stripping). Thus, when subjected to a stripping test, the crosslinked hardmask layer will have a percent stripping of less than about 5%, preferably less than about 1%, and more preferably about 0%. The stripping test involves first determining the thickness by taking the average of measurements at five different locations of the hardmask layer. This is the initial average film thickness. Next, the film is rinsed with a solvent or developer for about 30 seconds, followed by spin drying at about 500-3,000 rpm for about 20-60 seconds to remove the solvent. The thickness is measured again at those five points on the wafer using ellipsometry, and the average of these measurements is determined. This is the average final film thickness. The amount of stripping is the difference between the initial and final average film thicknesses. The percent stripping is:

$$\% \text{ stripping} = \left(\frac{\text{amount of stripping}}{\text{initial average film thickness}}\right) \times 100.$$

While the above lack of stripping is described with respect to hardmask layers, the same would be true for any other intermediate layer included under the inventive DSA layer, including those described above.

Some commercial hardmask layers can be used. Other preferred hardmask layers contain a copolymer of monomers selected from the group containing phenethyltrimethoxysilane (PETMS), 2-(carbomethoxy)ethyltrimethoxysilane (CMETMS), tetraethoxysilane (TEOS), methyltrimethoxysilane, and phenyltrimethoxysilane.

An optional carbon-rich layer can be formed by any known application method, with one preferred method being spin-coating at speeds from about 1,000 rpm to about 5,000 rpm, and preferably from about 1,250 rpm to about 1,750 rpm, for a time period of from about 30 seconds to about 120 seconds, and preferably from about 45 seconds to about 75 seconds. The term "carbon-rich" refers to layers formed from compositions comprising greater than about 50% by weight carbon, preferably greater than about 70% by weight carbon, and more preferably from about 75% to about 80% by weight carbon, based upon the total solids in the carbon-rich composition taken as 100% by weight. Suitable carbon-rich layers are selected from the group consisting of spin-on carbon layers (SOC), amorphous carbon layers, and carbon planarizing layers.

Exemplary carbon-rich layers will generally compromise a polymer dissolved or dispersed in a solvent system, along with one or more of the following optional ingredients: acid and/or base quenchers, catalysts, crosslinking agents, and surface modification additives. Preferred compositions will be suitable for forming thick layers and will preferably have solids content of from about 0.1% by weight to about 70% by weight, more preferably from about 5% by weight to about 40% by weight, and even more preferably from about 10% by weight to about 30% by weight, based upon the total weight of the carbon-rich composition taken as 100% by weight. After the carbon-rich composition is applied, it's preferably heated to a temperature from about 100° C. to about 300° C., and more preferably from about 160° C. to about 250° C., and for a time period of from about 30 seconds to about 120 seconds, and preferably from about 45 seconds to about 60 seconds, to evaporate solvents. The thickness of the carbon-rich layer after baking is preferably from about 10 nm to about 50,000 nm, more preferably from about 100 nm to about 5,000 nm, and even more preferably from about 500 nm to about 1,500 nm.

The substrate to which the DSA layer is applied is preferably a semiconductor substrate, such as those selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, or mixtures of the foregoing. Again, optional intermediate layers may be formed on the substrate prior to processing.

While the above describes a preferred embodiment, it will be appreciated that there are a number of variations that could be carried out. These variations are described and shown in detail in U.S. Patent Application No. 2013/0273330, previously incorporated by reference. For example, the invention could be utilized in lithography-assisted (e.g., graphoepitaxy) self-assembly. In summary, a stack is prepared as described above, using a substrate, optional intermediate layer (e.g., carbon-rich layer), and hardmask layer. In embodiments where a hardmask neutral layer is not used, a neutral or brush layer must be used on the hardmask layer to enable the DSA material to self-assemble.

An imaging layer is formed on the cured hardmask layer following conventional methods. Suitable photosensitive compositions for use as the imaging layer include any composition that can be patterned upon exposure to at least about 1 mJ/cm$^2$ radiation, such as photoresists, anti-reflective imaging layers, and the like. The imaging layer can then be post-application baked ("PAB") at a temperature of at least about 80° C., and preferably from about 100° C. to about 140° C., for time periods of from about 10 seconds to about 120 seconds (preferably from about 30 seconds to about 60 seconds). The thickness of the imaging layer is preferably from about 10 nm to about 300 nm, more preferably from about 20 nm to about 150 nm, and even more preferably from about 30 nm to about 100 nm.

That imaging layer can then be patterned, for example, by exposure to radiation (e.g., light in the case of optical lithography) of the appropriate wavelength, followed by development of the unexposed portions of the imaging layer, again following conventional methods. For example, the imaging layer could be exposed using a mask positioned above the imaging layer. The mask has open areas designed to permit radiation (hv) to pass through the mask and contact the imaging layer to yield exposed portions of the imaging layer that are rendered insoluble in solvent (when using a negative-tone photoresist). The remaining solid portions of the mask are designed to prevent radiation from contacting the imaging layer in certain areas to yield unexposed portions of the imaging layer that remain solvent soluble. Those skilled in the art will readily understand that the arrangement of open areas and solid portions is designed based upon the desired pattern to be formed in the imaging layer, although the present method is particularly suited for dark-field exposure where the majority of the imaging layer is shielded from radiation to form raised features such as lines and pillars. After exposure, the imaging layer is preferably subjected to a post-exposure bake ("PEB") at a temperature of from about 80° C. to about 150° C., more preferably from about 100° C. to about 130° C., for a time period of from about 30 seconds to about 60 seconds.

Upon exposure, the portions of the imaging layer that are exposed to radiation are rendered insoluble in organic (preferably non-alkaline) solvent developer. The exposed imaging layer is then contacted with solvent to remove the unexposed portions to form the desired "pre-pattern" in the imaging layer. Alternatively, when using a positive-tone photoresist, the exposed portions of the imaging layer can be rendered soluble in aqueous developer (e.g., an alkaline developer) or solvent during the exposure process, in which case, the removal process is reversed from what is described above. That is, the exposed portions are removed during development to form the pattern (not shown). In either embodiment, at least about 95% of the unexposed (or exposed, as the case may be) portions of the imaging layer 22 will preferably be removed by developer, more preferably at least about 99%, and even more preferably about 100% will be removed. Suitable non-alkaline solvent developers include n-butyl acetate, n-butyl propionate, isobutyl butyrate, and/or ketones (e.g., 2-heptanone). Suitable alkaline developers for positive-tone imaging layers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

Thus, pre-pattern formation results in portions of the hardmask layer underneath the imaging layer being uncovered or exposed when those selected portions of the imaging layer are removed from the stack. The resulting pre-pattern preferably comprises raised features (e.g., lines, pillars, square islands, or combinations thereof) formed on the hardmask layer. These features are chemically identical to the exposed portions of the imaging layer, and are each defined by respective sidewalls and respective top surfaces. It will be appreciated that in alternative embodiments, any other suitable patterning process may be used to pattern the imaging layer and form raised features, including multiple patterning processes, as well as immersion lithography. As mentioned above, it will also be appreciated that a positive-tone resist or photosensitive material could also be used, instead of the negative-tone imaging layer described herein. In that case, the unexposed portions of the imaging layer remain insoluble, while the exposed portions are rendered soluble and are removed with developer. Other patterning methods may also be used, including emerging technologies, such as imprint lithography, nano-imprint lithography, hot embossing lithography, and stamping pattern transfer. These technologies use a patterned mold to transfer patterns instead of relying on photolithographic patterning, as described above.

Regardless of the embodiment, once the desired pre-pattern is formed, a DSA composition according to the invention can be applied to the patterned stack, such that it flows into the spaces between the raised features (i.e., directly adjacent the hardmask), and adjacent the sidewalls of the raised features. In one or more embodiments, the self-assembling composition can also overcoat the top surfaces of the raised features. However, in other embodiments, the self-assembling composition preferably does not overcoat the top of the raised features. In other words, the self-assembling composition is deposited between the raised features and adjacent the feature sidewalls, but is absent from the top surfaces of the raised features. As a result, the top surface of the raised features remain open to be easily removed via solvent removal or etching, without the need for an etch-back step or other modification of the self-assembling layer to expose the pre-pattern.

The DSA composition can then be self-assembled or annealed as described above to yield first self-assembled regions and second self-assembled regions in the self-assembled or annealed layer, with one of the first or second self-assembled regions being adjacent the raised feature sidewalls, and the other of the first or second self-assembled regions segregated away from the raised features. For example, in the case of P(S-FS-VBCB)-b-PMMA block copolymer composition, the first blocks (i.e., the S-FS-VBCB blocks) would align adjacent to the photoresist sidewalls, while the second blocks (i.e., the PMMA blocks) would be drawn towards each other and are segregated between adjacent self-assembled regions of S-FS-VBCB.

Either of the first or second self-assembled regions can then be removed to generate a pattern. For example, the first self-assembled region can then be removed to generate a pattern in the DSA layer on the patterned stack, followed by transferring this pattern down into the hardmask and carbon-rich intermediate layer. It will be appreciated that instead of the first self-assembled region, the second self-assembled region could be removed instead. Regardless, the resulting pattern is eventually transferred down into the substrate. The pattern will typically be comprised of features such as lines, spaces, cylinders, and/or holes. Advantageously, these features will have an average (mean) respective feature size of less than about 20 nm, preferably less than about 15 nm, more preferably less than about 10 nm, and even more preferably from about 1 nm to about 10 nm. The term "feature size," as used herein, refers to the average (mean) width of the features as measured on an SEM cross-section of the stack (thus in the case of holes the width is the same as the hole diameter).

One advantage of the present invention is that, in embodiments where a hardmask neutral layer is utilized, the surface properties of that layer can be modified from a neutral layer that will facilitate aligning of the self-assembling materials to a non-alignment layer over which the self-assembling materials will not align during annealing or self-assembly. One possible avenue for modifying the hardmask layer involves chemoepitaxy. A stack is prepared comprising a substrate, optional intermediate layer, hardmask neutral layer, and imaging layer, as described above. A pre-pattern is created in the imaging layer, either using the method described previously, or any other conventional method. Thus, pre-pattern formation results in portions of the hardmask layer underneath the imaging layer being uncovered or exposed when those selected portions of the imaging layer are removed from the stack. The remaining portions of the imaging layer adjacent the hardmask serve as a mask for surface modification of the hardmask neutral layer. In one or more embodiments, the imaging layer is patterned using optical lithography and a developer (e.g., alkaline developer) or solvent rinse. Alternatively, the imaging layer is patterned using another suitable method, followed by contact with a developer solution (e.g., alkaline developer) or solvent. Regardless, the exposed portions of the hardmask layer are contacted with a developer solution (separately or during developer rinse). The remaining portions of the imaging layer are then removed (e.g., with solvent), yielding the hardmask layer having surface-modified regions and non-modified regions, where the surface-modified regions correspond to those portions of the hardmask that were uncovered during patterning of the imaging layer. Advantageously, contact with the developer (and particularly with an alkaline developer) changes the surface energy of the hardmask layer. In one or more embodiments, the surface energy is increased and causes the surface-modified regions of the hardmask to lose their ability to act as a neutral layer and induce alignment during the self-assembly process. However, the non-modified regions of the hardmask, which remained covered by the imaging layer during patterning and developer contact, still retain their neutral layer properties. Thus, the surface-modified regions correspond to non-aligning areas while the non-modified regions correspond to aligning areas on the hardmask. The active aligning areas therefore have the ability to become guiding structures for pattern formation during self-assembly.

A DSA layer is then formed directly on top of the surface-modified hardmask layer, such that there is direct contact between the DSA layer and surface-modified regions and non-modified regions. The DSA layer is then self-assembled as described above to allow the components to self-assemble. Because of the surface modification, the self-assembling layer will only self assemble into first self-assembled regions and second self-assembled regions in those portions of the DSA layer that are adjacent the non-modified areas of the hardmask. In other words, portions of the DSA layer adjacent the surface-modified areas of the hardmask do not separate or segregate into a pattern during annealing or self-assembly and are "unassembled" or "non-aligned." One of the first or second self-assembled regions can then be selectively removed, followed by etching the resulting pattern into the hardmask layer and optional intermediate layer. This pattern is eventually transferred down into the substrate.

In embodiments where a hardmask neutral layer is not utilized, an intermediate layer is required that will form modified and non-modified areas or regions, and the rest of the process would proceed as described above. In a further embodiment, this intermediate layer could be patterned directly, thus avoiding the need to use an imaging or photoresist layer that must ultimately be removed. That is, selective exposure to radiation will result in the creation of the surface-modified areas or regions noted above.

It will be appreciated that in each of the foregoing methods, self-assembly or annealing results in nanophase separation in the DSA layer, which permits the formation of nanometer-sized patterns generally not achievable using conventional optical lithography techniques. It will also be appreciated that although the present methods illustrate formation of at least two distinct annealed or self-assembled regions in the DSA layer, it is envisioned that additional DSA materials could be formulated that are capable of separation into more than two distinct phases, including third and fourth annealed or self-assembled regions.

EXAMPLES

The following examples set forth preferred methods in accordance with the invention. It is to be understood, however, that these examples are provided by way of illustration and nothing therein should be taken as a limitation upon the overall scope of the invention.

Example 1

Synthesis of 70/10/20 P(S-FS-VBCB)-b-PMMA)

A mixed solution of 518 milligrams of 2-cyano-2-propyl dodecyl trithiocarbonate (Sigma-Aldrich, St. Louis, Mo.), 35.0 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 24.6 milligrams of 2,2'-azobis (2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 16 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with a Mn of 13,300, Mw=14,800, and PDI of 1.11.

In the second step, 3.0 grams of PMMA prepared above, 5.80 grams of styrene (Sigma-Aldrich, St. Louis, Mo.), 2.08 grams of 4-vinylbenzocyclobutene (Sigma-Aldrich, St. Louis, Mo.), and 0.98 grams of 4-fluorostyrene (Sigma-Aldrich, St. Louis, Mo.) in 4 grams of toluene (Sigma-Aldrich, St. Louis, Mo.) was prepared in a round-bottom flask and stirred at room temperature for 15 minutes under nitrogen atmosphere. The solution was transferred into a Schlenk reaction flask, and 3.8 milligrams of 2,2'-azobis(2-methylpropionitrile) (Sigma-Aldrich, St. Louis, Mo.) was added. The Schlenk reaction flask was then de-gassed by three repeated freeze-evacuate-thaw cycles and sealed in vacuum. The polymerization was carried out at 90° C. for 17 hours. The reaction mixture obtained was diluted with 50 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 2

Synthesis of 60/20/20 P(S-FS-VBCB)-b-PMMA)

A mixed solution of 518 milligrams of 2-cyano-2-propyl dodecyl trithiocarbonate (Sigma-Aldrich, St. Louis, Mo.), 35.0 grams of methyl methacrylate (Sigma-Aldrich, St. Louis, Mo.) and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 24.6 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 16 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with a Mn of 13,300, Mw=14,800, and PDI of 1.11.

In the second step, 3.0 grams of PMMA prepared above, 4.80 grams of styrene (Sigma-Aldrich, St. Louis, Mo.), 2.01 grams of 4-vinylbenzocyclobutene (Sigma-Aldrich, St. Louis, Mo.), and 1.88 grams of 4-fluorostyrene (Sigma-Aldrich, St. Louis, Mo.) in 4 grams of toluene (Sigma-Aldrich, St. Louis, Mo.) was prepared in a round-bottom flask and stirred at room temperature for 15 minutes under nitrogen atmosphere. The solution was transferred into a Schlenk reaction flask, and 3.8 milligrams of 2,2'-azobis(2-methylpropionitrile) (Sigma-Aldrich, St. Louis, Mo.) was added. The Schlenk reaction flask was then de-gassed by three repeated freeze-evacuate-thaw cycles and sealed in vacuum. The polymerization was carried out at 90° C. for 17 hours. The reaction mixture obtained was diluted with 50 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 3

Synthesis of 40/20/40 P(S-FS-VBCB)-b-PMMA)

A mixed solution of 518 milligrams of 2-cyano-2-propyl dodecyl trithiocarbonate (Sigma-Aldrich, St. Louis, Mo.), 35.0 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 24.6 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 16 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with a Mn of 13,300, Mw=14,800, and PDI of 1.11.

In the second step, 3.3 grams of PMMA prepared above, 3.21 grams of styrene (Sigma-Aldrich, St. Louis, Mo.), 4.01 grams of 4-vinylbenzocyclobutene (Sigma-Aldrich, St. Louis, Mo.), and 1.88 grams of 4-fluorostyrene (Sigma-Aldrich, St. Louis, Mo.) in 4 grams of toluene (Sigma-Aldrich, St. Louis, Mo.) was prepared in a round-bottom flask and stirred at room temperature for 15 minutes under nitrogen atmosphere. The solution was transferred into a Schlenk reaction flask, and 3.8 milligrams of 2,2'-azobis(2-methylpropionitrile) (Sigma-Aldrich, St. Louis, Mo.) were added. The Schlenk reaction flask was then de-gassed by three repeated freeze-evacuate-thaw cycles and sealed in vacuum. The polymerization was carried out at 90° C. for 17 hours. The reaction mixture obtained was diluted with 50 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 4

Synthesis of 45/5/50 P(S-FS-VBCB)-b-PMMA)

A mixed solution of 690 milligrams of 2-cyano-2-propyl dodecyl trithiocarbonate (Sigma-Aldrich, St. Louis, Mo.), 38.0 grams of methyl methacrylate (Sigma-Aldrich, St. Louis, Mo.) and 30 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 41 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 16 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with a Mn of 11,300, Mw=12,900, and PDI of 1.15.

In the second step, 3.0 grams of PMMA prepared above, 3.61 grams of styrene (Sigma-Aldrich, St. Louis, Mo.), 5.01 grams of 4-vinylbenzocyclobutene (Sigma-Aldrich, St. Louis, Mo.), and 0.47 grams of 4-fluorostyrene (Sigma-Aldrich, St. Louis, Mo.) in 4 grams of toluene (Sigma-Aldrich, St. Louis, Mo.) were placed in a round-bottom flask and stirred at room temperature for 15 minutes under nitrogen atmosphere. The solution was transferred into a Schlenk reaction flask, and 4.1 milligrams of 2,2'-azobis(2-methylpropionitrile) (Sigma-Aldrich, St. Louis, Mo.) were added. The Schlenk reaction flask was then de-gassed by three repeated freeze-evacuate-thaw cycles and sealed in vacuum. The polymerization was carried out at 90° C. for 17 hours. The reaction mixture obtained was diluted with 50 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 5

Synthesis of 50/10/40 P(S-FS-VBCB)-b-PMMA)

A mixed solution of 504 milligrams of 2-cyano-2-propyl dodecyl trithiocarbonate (Sigma-Aldrich, St. Louis, Mo.), 40 grams of methyl methacrylate (Sigma-Aldrich, St. Louis, Mo.) and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 24.0 milligrams of 2,2'-azobis(2-methylpropionitrile) (Sigma-Aldrich, St. Louis, Mo.) were added afterwards. The Schlenk reaction flask was de-gassed by three consecutive freeze-evacuate-thaw cycles and sealed in vacuum. The polymerization was carried out at 60° C. for 16 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with a Mn of 12,500, Mw=14,200, and PDI of 1.14.

In the second step, 3.0 grams of PMMA prepared above, 4.00 grams of styrene (Sigma-Aldrich, St. Louis, Mo.), 4.01 grams of 4-vinylbenzocyclobutene (Sigma-Aldrich, St. Louis, Mo.), and 0.94 grams of 4-fluorostyrene (Sigma-Aldrich, St. Louis, Mo.) in 4 grams of toluene (Sigma-Aldrich, St. Louis, Mo.) were placed in a round-bottom flask and stirred at room temperature for 15 minutes under nitrogen atmosphere. The solution was transferred into a Schlenk reaction flask, and 4.1 milligrams of 2,2'-azobis(2-methylpropionitrile) (Sigma-Aldrich, St. Louis, Mo.) was added. The Schlenk reaction flask was then de-gassed by three repeated freeze-evacuate-thaw cycles and sealed in vacuum. The polymerization was carried out at 90° C. for 17 hours. The reaction mixture obtained was diluted with 50 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 50 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 6

Synthesis of 55/15/15/15 P(S-MS-FS-VBP)-b-PMMA)

A mixed solution of 692 milligrams of 2-cyano-2-propyl dodecyl trithiocarbonate (Sigma-Aldrich, St. Louis, Mo.), 40 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 28.0 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 17 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with Mn of 12,900, Mw of 14,200, and PDI of 1.10.

In the second step, 3.0 grams of the PMMA prepared above, 4.40 grams of styrene (Sigma-Aldrich, St. Louis, Mo.), 2.70 grams of 4-vinylbiphenyl (Sigma-Aldrich, St. Louis, Mo.), 1.77 grams of 4-methylstyrene (Sigma-Aldrich, St. Louis, Mo.), and 1.41 grams of 4-fluorostyrene (Sigma-Aldrich, St. Louis, Mo.) in 4.0 grams of toluene (Sigma-Aldrich, St. Louis, Mo.) were added into a round-bottom flask and stirred at room temperature for 15 minutes under nitrogen atmosphere. The obtained solution was transferred into a Schlenk reaction flask, and 3.8 milligrams of 2,2'-azobis(2-methylpropionitrile) (Sigma-Aldrich, St. Louis, Mo.) were added. The Schlenk reaction flask was then de-gassed by three repeated freeze-evacuate-thaw cycles and sealed in vacuum. The polymerization was carried out at 85° C. for 16 hours. The reaction mixture obtained was diluted with 40 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 40 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 7

Synthesis of 50/20/20/10 P(S-MS-FS-VBP)-b-PMMA

A mixed solution of 692 milligrams of 2-cyano-2-propyl dodecyl trithiocarbonate (Sigma-Aldrich, St. Louis, Mo.), 40 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 28.0 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 17 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with Mn of 12,900, Mw of 14,200, and PDI of 1.10.

In the second step, 3.0 grams of the PMMA prepared above, 5.20 grams of styrene (Sigma-Aldrich, St. Louis, Mo.), 3.60 grams of 4-vinylbiphenyl (Sigma-Aldrich, St. Louis, Mo.), 2.34 grams of 4-methylstyrene (Sigma-Aldrich, St. Louis, Mo.), and 1.21 grams of 4-fluorostyrene (Sigma-Aldrich, St. Louis, Mo.) in 4.0 grams of toluene (Sigma-Aldrich, St. Louis, Mo.) were added into a round-bottom flask and stirred at room temperature for 15 minutes under nitrogen atmosphere. The obtained solution was transferred into a Schlenk reaction flask, and 3.8 milligrams of 2,2'-azobis(2-methylpropionitrile) (Sigma-Aldrich, St. Louis, Mo.) was added. The Schlenk reaction flask was then de-gassed by three repeated freeze-evacuate-thaw cycles and sealed in vacuum. The polymerization was carried out at 85° C. for 16 hours. The reaction mixture obtained was diluted with 40 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 40 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 8

Synthesis of 40/20/20/20 P(S-MS-FS-VBP)-b-PMMA

A mixed solution of 692 milligrams of 2-cyano-2-propyl dodecyl trithiocarbonate (Sigma-Aldrich, St. Louis, Mo.), 38 grams of methyl methacrylate (Sigma-Aldrich, St. Louis, Mo.), and 28 milliliters of toluene (Sigma-Aldrich, St. Louis, Mo.) was prepared in a round-bottom flask and stirred at room temperature for 15 minutes under nitrogen atmosphere. The prepared solution was transferred into a Schlenk reaction flask, and 24.0 milligrams of 2,2'-azobis(2-methylpropionitrile) (Sigma-Aldrich, St. Louis, Mo.) was added afterwards. The Schlenk reaction flask was de-gassed by three consecutive freeze-evacuate-thaw cycles and sealed in vacuum. The polymerization was carried out at 60° C. for 17 hours. A viscous reaction mixture was obtained and diluted with 50 milliliters of dichloromethane (Sigma-Aldrich, St. Louis, Mo.). The polymer product was precipitated in 1 liter of methanol (Sigma-Aldrich, St. Louis, Mo.) and collected by filtration. The polymer solid obtained was further purified by re-dissolving in 50 milliliters of dichloromethane (Sigma-Aldrich, St. Louis, Mo.) and precipitating into 1 liter of methanol (Sigma-Aldrich, St. Louis, Mo.), and then dried in a vacuum oven at 45° C. for 24 hours. The polymer product, PMMA with a trithiocarbonate end group, was analyzed by GPC with Mn of 12,100, Mw of 14,000, and PDI of 1.16.

In the second step, 3.0 grams of the PMMA prepared above, 4.16 grams of styrene (Sigma-Aldrich, St. Louis, Mo.), 3.60 grams of 4-vinylbiphenyl (Sigma-Aldrich, St. Louis, Mo.), 2.36 grams of 4-methylstyrene (Sigma-Aldrich, St. Louis, Mo.), and 2.43 grams of 4-fluorostyrene (Sigma-Aldrich, St. Louis, Mo.) in 4.0 grams of toluene (Sigma-Aldrich, St. Louis, Mo.) were added into a round-bottom flask and stirred at room temperature for 15 minutes under nitrogen atmosphere. The obtained solution was transferred into a Schlenk reaction flask, and 3.8 milligrams of 2,2'-azobis(2-methylpropionitrile) (Sigma-Aldrich, St. Louis, Mo.) was added. The Schlenk reaction flask was then de-gassed by three repeated freeze-evacuate-thaw cycles and sealed in vacuum. The polymerization was carried out at 85° C. for 17 hours. The reaction mixture obtained was diluted with 40 milliliters of dichloromethane (Sigma-Aldrich, St. Louis, Mo.) and precipitated in 0.8 liter methanol (Sigma-Aldrich, St. Louis, Mo.). The polymer collected by filtration was further purified by re-dissolving in 40 milliliters of dichloromethane (Sigma-Aldrich, St. Louis, Mo.) and precipitating into 0.8 liter of methanol (Sigma-Aldrich, St. Louis, Mo.), and then dried in a vacuum oven at 45° C. for 24 hours.

Example 9

Molecular Weight and Polydispersity of BCPs

The molecular weight and polydispersity of each prepared BCP were measured by GPC. The results are shown in Table 1. The GPC parameters were: Mobile phase THF; Column-WATERS Styragel HR 3, 708×300 mm; Flow rate—0.5 ml/min; Detector—R1; Column Temperature 40° C.; Polystryrene Standards used for Calibration and for the PMMA polymers PMMA standards were used.

TABLE 1

| Molecular Weight and Polydispersity | | | |
|---|---|---|---|
| Material ID | Mw | Mn | PDI |
| Example 1 | 28.3K | 23.1K | 1.22 |
| Example 2 | 29.4K | 24.2K | 1.22 |
| Example 3 | 26.7K | 21.0K | 1.28 |
| Example 4 | 16.0K | 18.9K | 1.18 |
| Example 5 | 20.9K | 23.7K | 1.13 |
| Example 6 | 22.5K | 24.8K | 1.10 |

TABLE 1-continued

Molecular Weight and Polydispersity

| Material ID | Mw | Mn | PDI |
|---|---|---|---|
| Example 7 | 24.2K | 26.5K | 1.10 |
| Example 8 | 24.2K | 26.1K | 1.08 |

Example 10

Strip Testing of BCPs

Strip testing was performed using a Brewer Science® Cee® CB100 coat and bake tool. Spin speeds were varied from 1,000 rpm to 2,000 rpm in 250-rpm increments. The ramp speed was 10,000 rpm with a duration of 60 seconds. A dual stage bake was performed at 180° C. for 3 minutes (to achieve micro-phase separation of the BCP) and then at 230° C. for 2 minutes (to crosslink the material). Initial thickness values were obtained from measurements on an M2000 VUV VASE. The coated wafers were then developed using a 60-second puddle of PGMEA and then spun dry at 1,000 rpm for 30 seconds. A second thickness measurement was then taken on the VASE tool to determine the thickness loss.

TABLE 2

Percentage Thickness Loss After Strip Test

| Spin Speed rpm | Example 1 Thickness Loss (%) | Example 2 Thickness Loss (%) | Example 3 Thickness Loss (%) | Example 4 Thickness Loss (%) | Example 5 Thickness Loss (%) |
|---|---|---|---|---|---|
| 1000 | 6.2 | 4.9 | 2.2 | 2.7 | 2.2 |
| 1250 | 5.5 | 4.9 | 2.1 | 2.4 | 1.9 |
| 1500 | 5.5 | 4.8 | 1.9 | 2.3 | 1.7 |
| 1750 | 5.2 | 4.8 | 1.9 | 1.9 | 1.6 |
| 2000 | 4.1 | 4.4 | 1.6 | 1.7 | 0.8 |

TABLE 3

Percentage Thickness Loss After Strip Test - Non-Crosslinked BCP

| Spin Speed rpm | Example 6 Thickness Loss (%) | Example 7 Thickness Loss (%) | Example 8 Thickness Loss (%) |
|---|---|---|---|
| 1000 | 82.3 | 79.8 | 81.4 |
| 1500 | 79.5 | 75.7 | 77.3 |
| 2000 | 77.3 | 73.3 | 74.2 |
| 2500 | 74.6 | 69.8 | 70.2 |

Example 11

SEM Images of Annealed BCPs

The BCBs prepared in Examples 1-8 were annealed and examined under SEM. For the compositions of Examples 1-5, a hardmask layer from U.S. Patent Publication No. 2013/0273330, incorporated by reference herein, was formed on respective silicon wafers. For the compositions of Examples 6-8, a neutral layer formed from a composition that included a random copolymer of the monomers of each BCP was formed on respective silicon wafers.

The particular block copolymer composition to be tested was then spin-coated onto the neutral or hardmask layer to yield a total thickness of about 20 nm for both the underlying neutral or hardmask and the DSA layer. A thermal annealing was carried out at 150-250° C. for 30 seconds to 10 minutes (usually 5 minutes) on a hot plate.

Figure 2:
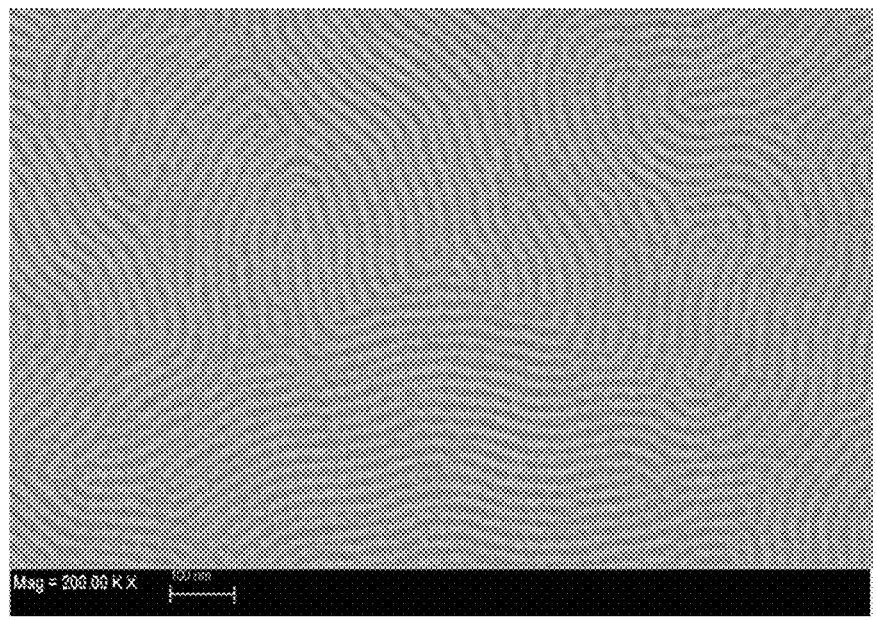
FIG. 2 is an SEM image of a fingerprint of the annealed BCP of Example 2.
Figure 3:
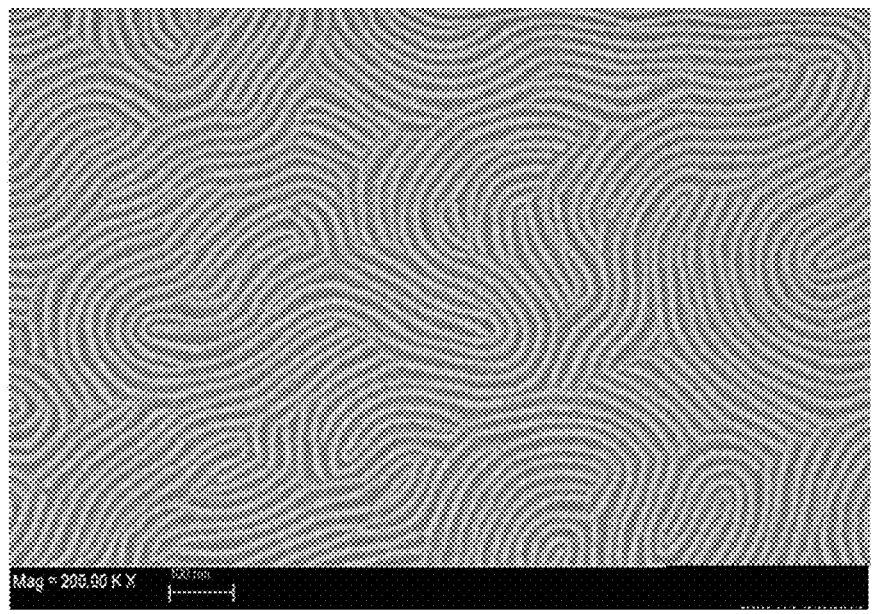
FIG. 3 is an SEM image of a fingerprint of the annealed BCP of Example 3.
Figure 4:
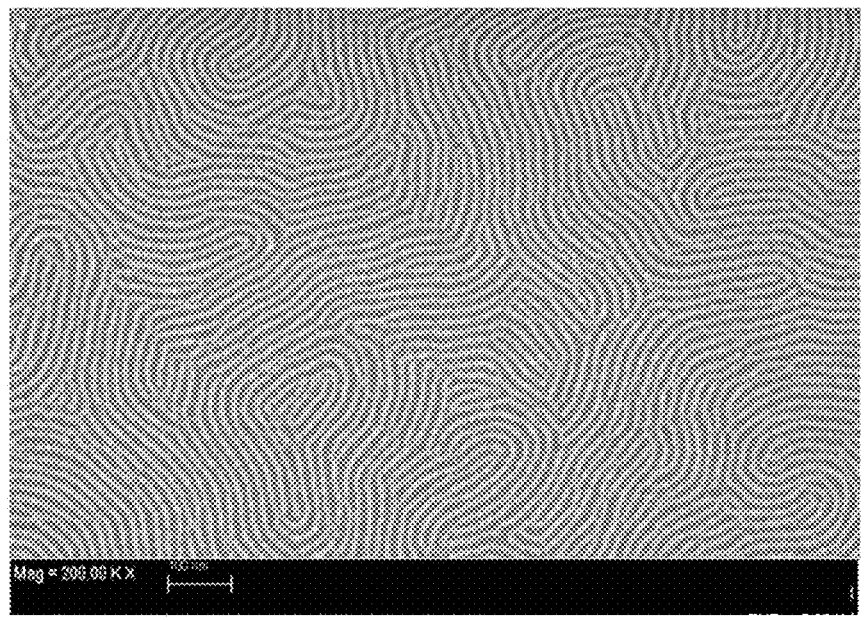
FIG. 4 is an SEM image of a fingerprint of the annealed BCP of Example 4.
Figure 5:
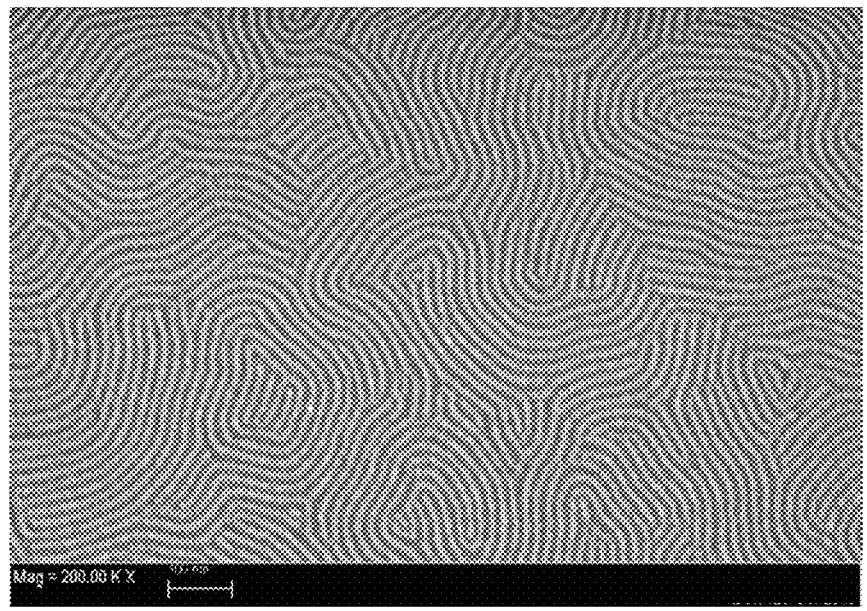
FIG. 5 is an SEM image of a fingerprint of the annealed BCP of Example 5.
Figure 6:
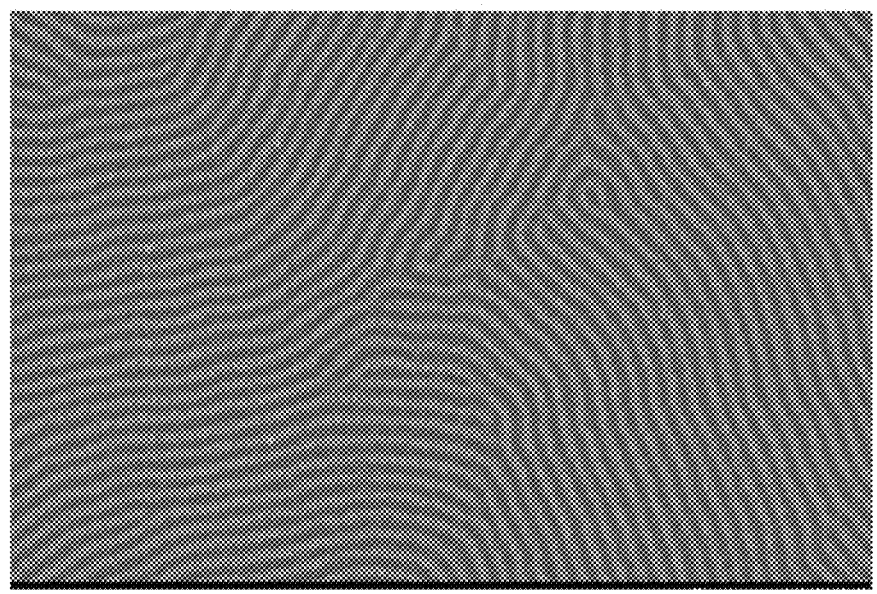
FIG. 6 is an SEM image of a fingerprint of the annealed BCP of Example 6.
Figure 7:
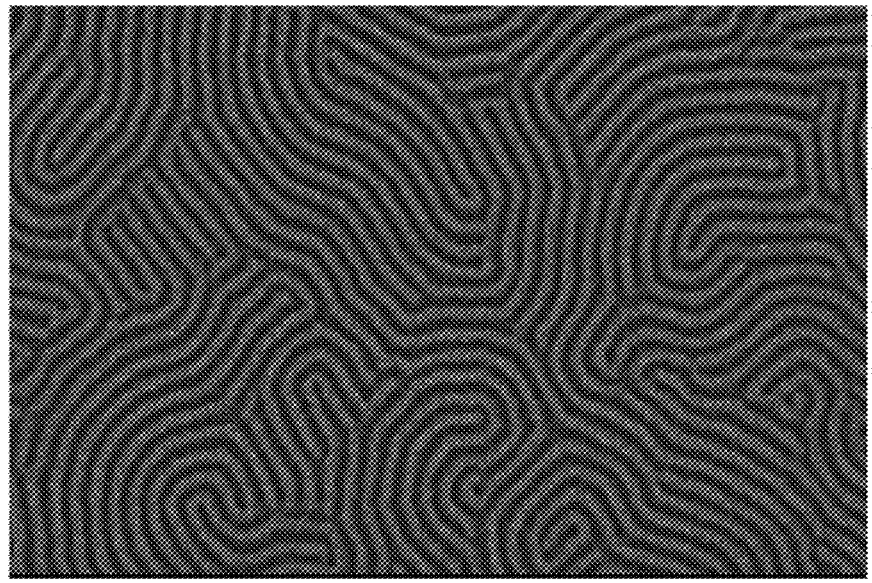
FIG. 7 is an SEM image of a fingerprint of the annealed BCP of Example 7.
Figure 8:
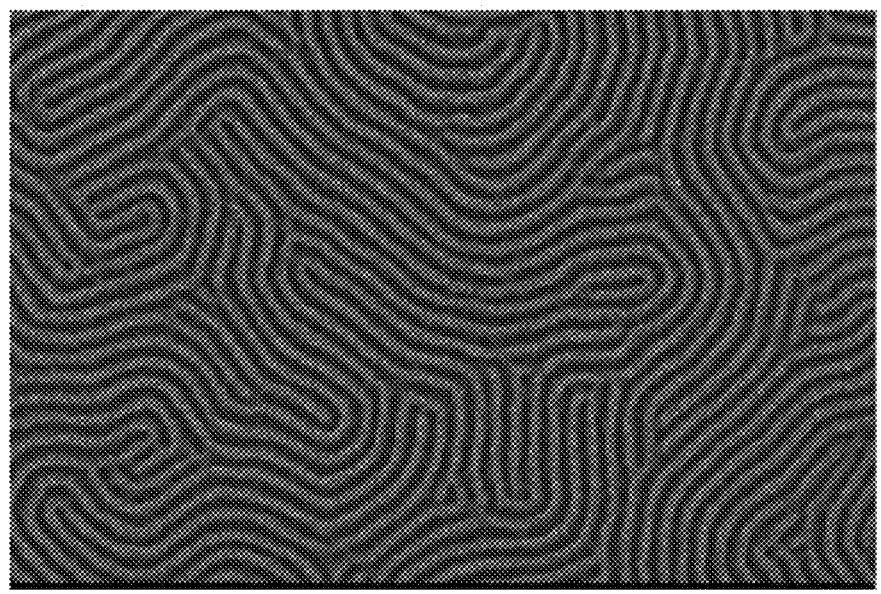
FIG. 8 is an SEM image of a fingerprint of the annealed BCP of Example 8.

SEM images of the annealed BCPs were taken using a JEOL SEM (Mag 200.00 kx, EHT 5 kV). These images are shown in FIGS. 1-8.

Example 12

$L_0$ Measurements and Line/Space Measurements

Measurements of $L_0$ and critical dimensions of the lines and spaces from Example 11 were taken using ImageJ software. Six locations were measured per SEM image and averaged to find the final $L_0$ values.

TABLE 4

Lines/spaces and $L_0$ Measurements

| Material ID | # SEM Lines Measured | Total Value (nm) | $L_0$ Value | Lines/Spaces (nm) |
|---|---|---|---|---|
| Example 1 | 10 | 204 | 20.4 | 10.2 |
| Example 2 | 10 | 209 | 20.9 | 10.5 |
| Example 3 | 10 | 193 | 19.3 | 8.7 |
| Example 4 | 10 | 175 | 17.5 | 8.8 |
| Example 5 | 10 | 182 | 18.2 | 9.1 |
| Example 6 | 10 | 198 | 19.8 | 9.9 |
| Example 7 | 10 | 196 | 19.6 | 9.8 |
| Example 8 | 10 | 192 | 19.2 | 9.6 |

We claim:

1. A method of forming a microelectronic structure, said method comprising:
    providing a stack comprising:
        a substrate having a surface; and
        one or more optional intermediate layers on said substrate surface;
    applying a composition to said intermediate layers, if present, or to said substrate surface, if no intermediate layers are present, said composition comprising a block copolymer comprising a first block and a second block, said first block being selected from the group consisting of (I) and (II) below:
        (I) a polymer comprising random monomers of vinylbenzocyclobutene, styrene, and a monomer other than styrene or vinylbenzocyclobutene, wherein said monomer other than styrene or vinylbenzocyclobutene is a styrene-containing monomer; and
        (II) a polymer comprising random monomers of vinyl biphenyl and styrene; and
    said composition self-assembling into a self-assembled layer, wherein said self-assembled layer comprises a first self-assembled region and a second self-assembled region different from said first self-assembled region.

2. The method of claim 1, wherein said first block is polymer (I).

3. The method of claim 1, wherein said first block polymer is polymer (I) and said monomer other than styrene or vinylbenzocyclobutene is selected from the group consisting of fluorostyrene, vinylpyridine, butyl styrene, vinylanisole, methyl styrene, and trifluoromethylstyrene.

4. The method of claim 3, wherein said monomer other than styrene or vinylbenzocyclobutene comprises fluorostyrene.

5. The method of claim 1, wherein said first block is polymer (II), and said polymer (II) further comprises at least one monomer other than vinyl biphenyl or styrene.

6. The method of claim 5, wherein said at least one monomer other than vinyl biphenyl or styrene is selected from the group consisting of styrene-containing monomers, vinylpyridine, vinyl naphthalene, methyl styrene, and fluorostyrene.

7. The method of claim 6, wherein both methyl styrene and fluorostyrene are present as monomers in said polymer (II).

8. The method of claim 1, wherein said block copolymer has a X value that is at least about 1.5 times the $\chi$ value of a polystyrene and poly(methyl methacrylate) block copolymer.

9. The method of claim 1, wherein said second block is a polymer comprising monomers selected from the group consisting of methyl methacrylate, lactic acid, ethylene oxide, methyl acrylate, vinyl ester, and vinyl amide.

10. The method of claim 9, wherein said second block is poly(methyl methacrylate).

11. The method of claim 1, further comprising heating said composition to at least about the glass transition temperature of said block copolymer, said self-assembling occurring during said heating.

12. The method of claim 11, wherein said first block is polymer (I), and further comprising a second heating so as to cause said block copolymer to self-crosslink during said heating.

13. The method of claim 11, wherein said first block is polymer (II), and said block copolymer does not crosslink during heating.

14. The method of claim 1, wherein said stack comprises an intermediate layer selected from the group consisting of bottom anti-reflective coatings, neutral brush layers, hardmask neutral layers, hardmasks, spin-on carbon layers, etch block layers, and imaging layers.

15. The method of claim 1, wherein said substrate is a semiconductor substrate.

16. The method of claim 15, wherein said substrate is selected from the group consisting of silicon, SiGe, $SiO_2$, $Si_3N_4$, SiON, aluminum, tungsten, tungsten silicide, gallium arsenide, germanium, tantalum, tantalum nitride, $Ti_3N_4$, hafnium, $HfO_2$, ruthenium, indium phosphide, coral, black diamond, glass, and mixtures of the foregoing.

17. The method of claim 1, further comprising removing said second self-assembled region to yield a pattern in said self-assembled layer.

18. The method of claim 15, further comprising transferring said pattern into said one or more intermediate layers, if present, and into said substrate, wherein said pattern comprises a plurality of features selected from the group consisting of trenches, spaces, via holes, contact holes having an average feature size of less than about 20 nm.

19. The method of claim 1, wherein an intermediate layer is present, said intermediate layer comprising a pre-pattern comprising a plurality of raised features, said raised features being spaced apart and each being defined by respective sidewalls and a top surface, wherein said self-assembling composition is applied directly on top of said intermediate layer in spaces between said raised features.

20. The method of claim 19, wherein said plurality of raised features are formed by:
applying a photosensitive composition to form an imaging layer on any other intermediate layer, if present, or on said substrate surface, if no other intermediate layers are present; and
patterning said imaging layer to yield said pre-pattern, before applying said composition to said imaging layer.

21. The method of claim 20, wherein said patterning comprises:
exposing said imaging layer to radiation to yield exposed and unexposed portions of said imaging layer, and
contacting said imaging layer with a developer so as to remove one of said exposed or unexposed portions.

22. The method of claim 1, wherein at least one intermediate layer is present, said intermediate layer being selected from the group consisting of hardmask layers and neutral layers, and wherein said intermediate layer comprises a surface having surface-modified regions and non-modified regions, said first and second self-assembled regions being adjacent said non-modified regions.

23. The method of claim 22, wherein, before applying said composition to said intermediate layer, said surface-modified regions and non-modified regions are formed by:
forming an imaging layer on said intermediate layer; and
patterning said imaging layer to yield a pre-pattern, wherein said patterning comprises selectively removing portions of said imaging layer to uncover portions of said intermediate layer;
contacting said uncovered portions of intermediate layer with a developer or solvent to yield said surface-modified regions; and
removing remaining portions of said imaging layer from said intermediate layer to yield said non-modified regions.

24. The method of claim 22, wherein, before applying said composition to said intermediate layer, said surface-modified regions and non-modified regions are formed by selectively exposing said intermediate layer to radiation.

25. The method of claim 1, wherein said self-assembling of said composition occurs after said applying, without applying a further layer being formed on, or a second composition being applied to, said composition.

26. The method of claim 1, wherein said vinylbenzocyclobutene is 4-vinylbenzocyclobutene, and said vinyl biphenyl is 4-vinyl biphenyl.

* * * * *